(12) United States Patent
Oh

(10) Patent No.: US 7,846,490 B2
(45) Date of Patent: Dec. 7, 2010

(54) PIEZOELECTRIC SUBSTRATE AND SURFACE ACOUSTIC WAVE FILTER USING THE SAME

(76) Inventor: Young Joo Oh, #1401 Villpolaris, 49-5 Jamwon-dong, Seocho-gu, Seoul 137-906 (KR)

( * ) Notice: Subject to any disclaimer, the term of this patent is extended or adjusted under 35 U.S.C. 154(b) by 91 days.

(21) Appl. No.: 12/153,909

(22) Filed: May 28, 2008

(65) Prior Publication Data
US 2009/0224853 A1 Sep. 10, 2009

(30) Foreign Application Priority Data
Mar. 7, 2008 (KR) .................. 10-2008-0021308

(51) Int. Cl.
*B05D 5/12* (2006.01)
*H01L 41/18* (2006.01)
(52) U.S. Cl. ...................... 427/100; 29/25.35
(58) Field of Classification Search ............. 427/100; 29/25.35; 310/313 R, 313 B; 393/193
See application file for complete search history.

(56) References Cited
U.S. PATENT DOCUMENTS
4,684,841 A * 8/1987 Este et al. ............... 310/313 B
7,213,314 B2 5/2007 Abbott et al.
7,432,571 B2 * 10/2008 Lee et al. .................. 257/414
7,497,962 B2 * 3/2009 Tokunaga .................. 216/27

\* cited by examiner

*Primary Examiner*—Brian K Talbot
(74) *Attorney, Agent, or Firm*—Rosenberg, Klein & Lee

(57) ABSTRACT

Disclosed are a piezoelectric substrate and a surface acoustic wave (SAW) filter. A piezoelectric substrate 10a includes a base member 11 including an oxide layer 12 with a plurality of grooves 12a on one surface of the base member 11; a buffer member 13 being formed on the oxide layer 12 to expose one end and another end of the oxide layer 12; an insulating member 14 being formed on another surface of the base member 11; and a piezoelectric member 15 being formed on the buffer member 13. A SAW filter using the piezoelectric substrate 10a, includes the base member 11 including the oxide layer 12 with the plurality of grooves 12a on one surface; the buffer member 13; the insulating member 14; the piezoelectric member 15; and a plurality of interdigital transducer (IDT) electrodes 17 and 17 being formed on the piezoelectric member 15 to receive an electrical signal, filter the electrical signal, and output the filtered electrical signal.

7 Claims, 4 Drawing Sheets

PIEZOELECTRIC SUBSTRATE AND SURFACE ACOUSTIC WAVE FILTER USING THE SAME

BACKGROUND

1. Field

The present invention relates to a piezoelectric substrate and a surface acoustic wave (SAW) filter, and more particularly, to a piezoelectric substrate and a SAW filter that can improve thermal transmission and remove bi-directional loss by surface wave reflection by a plurality of grooves.

2. Background

A surface acoustic wave (SAW) filter is used as a frequency filter that can generate and distribute elastic surface waves by a voltage when the voltage is supplied and thereby can filter the elastic surface waves. The SAW filter includes various types such as a plurality of normal state interdigital transducer (IDT) electrodes and weighted IDT electrodes. In the case of the normal state IDT electrodes, the overlap size between the electrodes is constant. On the other hand, in the case of the weighted IDT electrodes, the pitch and the overlap size between the electrodes changes.

FIG. 1 is a perspective view of a conventional SAW filter. As shown in FIG. 1, the conventional SAW filter includes a piezoelectric substrate 1, a plurality of IDT electrodes 2 and 3, and a plurality of reflectors 4 and 5. Hereinafter, each component will be described.

The piezoelectric substrate 1 used for the SAW filter is formed by manufacturing lithium niobium oxide ($LiNbO_3$), lithium tantalum oxide ($LiTaO_3$), quartz, and the like in ingot and then subsequently cutting the ingot using a crystal growth scheme. In the case of the piezoelectric substrate applied with the crystal growth scheme, the piezoelectric substrate may have an excellent electrical characteristic. However, when manufacturing such piezoelectric substrate, expensive equipments may be needed and thus manufacturing costs may increase. In order to solve the above problems, the piezoelectric substrate 1 shown in FIG. 1 is applied.

The piezoelectric substrate 1 consists of a wafer 1a made of silicon (Si) or diamond, a piezoelectric member 1b, and a buffer member 1c.

The plurality of IDT electrodes 2 and 3, and the plurality of reflectors 4 and 5 are formed on the piezoelectric member 1b. The piezoelectric member 1b is formed on the wafer 1a made of Si or diamond. The piezoelectric member 1b may use alumina ($Al_2O_3$), AnO, AlN, barium titan oxide ($BaTiO_3$), or PZT series of piezoelectric ceramic and a piezoelectric material with greater piezoelectric coefficient. When disposing the piezoelectric member 1b on the wafer 1a made of Si or diamond, the piezoelectric performance may be deteriorated due to a surface phenomenon. Also, when forming the piezoelectric member 1b on the wafer 1a made of Si, the piezoelectric member 1b is formed in a crystal direction and thus a process condition becomes difficult. In order to solve the above problem, the buffer member 1c is interposed between the wafer 1a and the piezoelectric member 1b. The buffer member 1c uses any one of silicon oxide (SiO2), alumina ($Al_2O_3$), and oxide tantalum ($Ta_2O_5$) to thereby remove the surface phenomenon when forming the piezoelectric member 1b on the wafer 1a and improve the deterioration of the piezoelectric performance or the process condition.

The plurality of IDT electrodes 2 and 3 includes the input IDT electrode 2 and the output IDT electrode 3 to which input/output electrodes T1 and T2 are connected respectively. A pattern of the plurality of IDT electrodes 2 and 3 is formed by photo etching after forming a conductive material on the piezoelectric substrate 1.

The plurality of reflectors 4 and 5 is formed on the piezoelectric substrate 1 so that the surface elastic wave energy generated from the plurality of IDT electrodes 2 and 3 may be located at an outside of the plurality of IDT electrodes 2 and 3 according to a resonant condition. Through this, it is possible to minimize the surface wave reflection and thereby remove the bidirectional loss. As shown in FIG. 1, the plurality of reflectors 4 and 5 forms a metal film in grating. In addition to the reflectors 4 and 5, an absorber (not shown) is provided to form grooves (not shown) on the piezoelectric substrate 1. When a piezoelectric substrate of a conventional surface acoustic wave (SAW) filter forms a buffer member between a wafer made of silicon (Si) or diamond and a piezoelectric member to thereby improve a surface phenomenon, a serious problem may occur in the crystal structure. Specifically, in comparison to a single crystal, since a thin film is formed, durability power may be decreased. Also, since an absorber including a groove or a reflector in grating structure of a metal thin film on a piezoelectric substrate is formed, it is difficult to reduce the size of the SAW filter.

The present invention is conceived to solve the above described problems and thus provides a piezoelectric substrate that can form an oxide layer with a plurality of grooves on a base member, selectively form a buffer member and a piezoelectric member on the oxide member and thereby can improve thermal transmission by the plurality of grooves and also can be readily manufactured, and a manufacturing method of the same.

The present invention also provides a SAW filter that can form an oxide layer with a plurality of grooves on a base member, selectively form a buffer member and a piezoelectric member on the oxide layer, and thereby can remove bidirectional loss by the surface wave reflection of the plurality of grooves formed on a piezoelectric substrate and thus can reduce the size, and a manufacturing method of the same.

According to an aspect of the present invention, there is provided a piezoelectric substrate including: a base member including an oxide layer with a plurality of grooves on one surface of the base member; a buffer member being formed on the oxide layer to expose one end and another end of the oxide layer; an insulating member being formed on another surface of the base member; and a piezoelectric member being formed on the buffer member.

According to another aspect of the present invention, there is provided a method of manufacturing a piezoelectric substrate, including: forming an oxide layer with a plurality of grooves on one surface of a base member by anodizing; selectively applying a buffer material on the oxide layer to expose one end and another end of the oxide layer to form a buffer member; applying an insulating material on another surface of the base member to form an insulating member; and applying a piezoelectric material on the buffer member to form a piezoelectric member.

According to still another aspect of the present invention, there is provided a surface acoustic wave (SAW) filter including: a base member including an oxide layer with a plurality of grooves on one surface; a buffer member being formed on the oxide layer to expose one end and another end of the oxide layer; an insulating member being formed on another surface of the base member; a piezoelectric member being formed on the buffer member; and a plurality of interdigital transducer (IDT) electrodes being formed on the piezoelectric member to receive an electrical signal, filter the electrical signal, and output the filtered electrical signal.

According to yet another aspect of the present invention, there is provided a method of manufacturing a SAW filter, including: forming an oxide layer with a plurality of grooves on one surface of a base member by anodizing; selectively applying a buffer material on the oxide layer to expose one end and another end of the oxide layer to form a buffer member; applying an insulating material on another surface of the base member to form an insulating member; applying a piezoelectric material on the buffer member to form a piezoelectric member; and applying a conductive material on the piezoelectric member to form a plurality of IDT electrodes by photo etching.

BRIEF DESCRIPTION OF THE DRAWINGS

The embodiments will be described in detail with reference to the following drawings in which like reference numerals refer to like elements wherein.

DETAILED DESCRIPTION

Hereinafter, embodiments of a piezoelectric substrate according to the present invention will be described with reference to the accompanying drawings.

Figure 2:
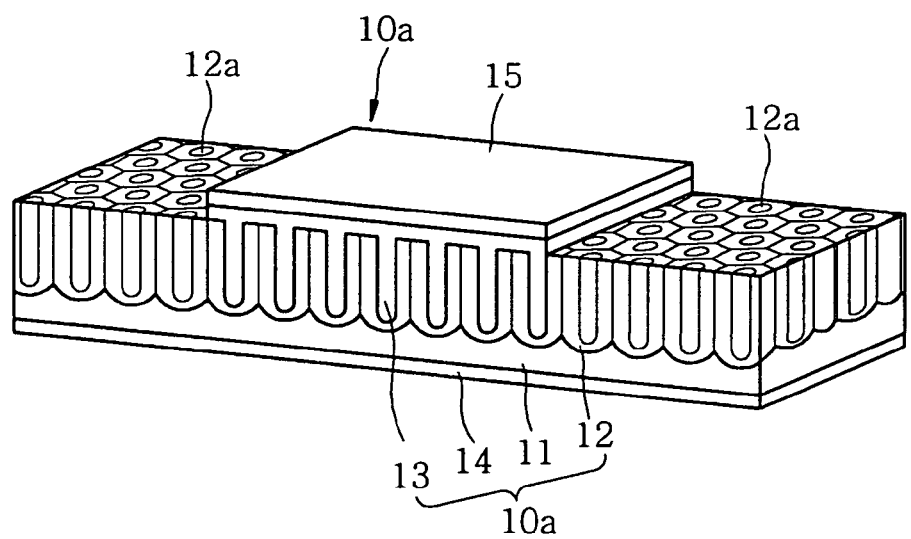
FIG. 2 is a perspective view of a piezoelectric filter according to the present invention.
Figure 3:
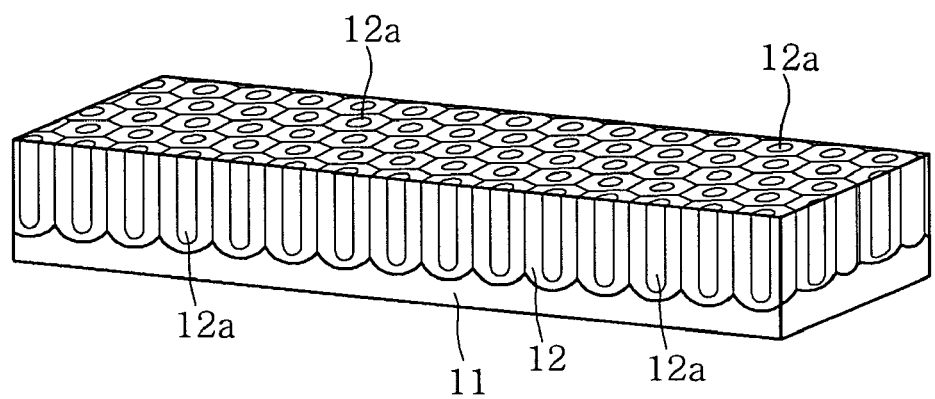
FIG. 3 is a perspective view of a base member shown in FIG. 2.

FIG. 2 is a perspective view of a piezoelectric filter 10a according to the present invention, and FIG. 3 is a perspective view of a base member 11 shown in FIG. 2. As shown in FIGS. 2 and 3, the piezoelectric substrate 10a includes the base member 11, an oxide layer 12, a buffer member 13, an insulating member 14, and a piezoelectric member 15.

Figure 6:
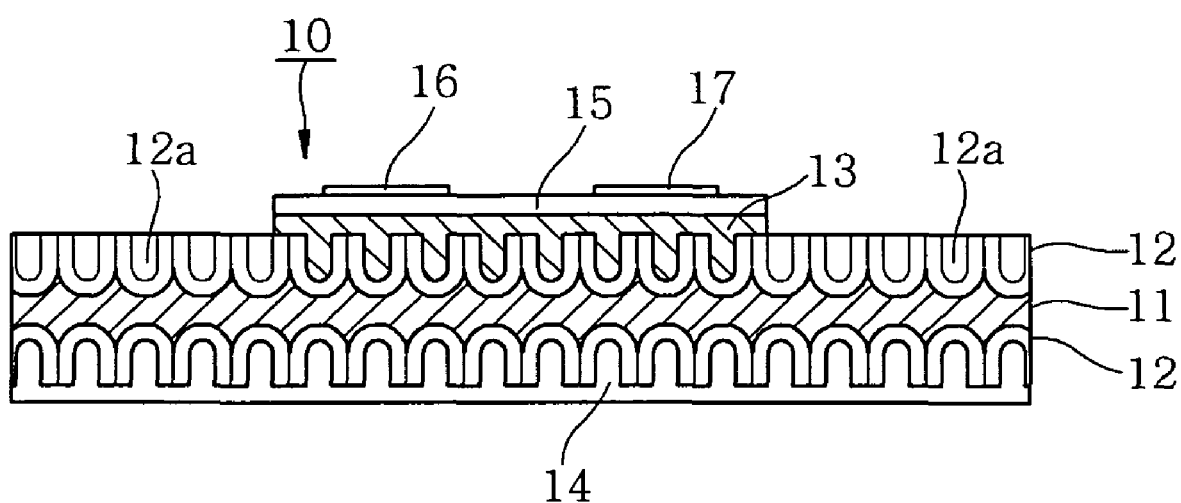
FIG. 6 is a side cross-sectional view illustrating another embodiment of a base member shown in FIG. 5.

As shown in FIGS. 2 and 3, the base member 11 includes the oxide layer 12 that is formed with a plurality of grooves 12a on one surface. The plurality of grooves 12a formed on the oxide layer 12a is formed to have a nano-pore array structure by anodizing, as shown in FIG. 3. Since the plurality of grooves 12a formed on the oxide layer 12 has the nano-pore array structure, it is possible to increase the surface area and thereby improve thermal transmission. Therefore, it is possible to readily discharge heat generated from a SAW filter 10 of FIG. 4 to an outside. The plurality of grooves 12a formed to more readily discharge the heat generated from the SAW filter 10 to the outside may be formed on one surface of the base member 11 as shown in FIG. 3, or may be formed on both surfaces of the base member 11 as shown in FIG. 6.

The base member 11 formed with the oxide layer 11 may use aluminum (Al), niobium (Nb), tantalum (Ta), zirconium (Zr), titanium (Ti), copper (Cu), carbon monoxide (NbO), and zinc (Zn), or at least two different alloys thereof, or all general metals. Specifically, a metal member such as aluminum (Al), niobium (Nb), tantalum (Ta), zirconium (Zr), titanium (Ti), copper (Cu), and zinc (Zn) may be individually selected and then be applied. Also, alloys of aluminum (Al) and niobium (Nb), or alloys of aluminum (Al), niobium (Nb), and tantalum (Ta) may be applied. Such the base member 11 may adopt a solid member such as carbon monoxide (NbO).

The oxide layer 12 formed on the base member 11 may use any one of alumina ($Al_2O_3$), oxide niobium ($Nb_2O_5$), oxide tantalum ($Ta_2O_5$), oxide zirconium ($ZrO_2$), oxide titanium ($TiO_2$), oxide copper (CuO), and oxide zinc (ZnO) depending on a material of the base member 11.

The buffer member 13 may be formed on the oxide layer 12 to expose one end and another end of the oxide layer 12 as a buffer layer for removing the surface effect. The surface effect may occur when directly forming the piezoelectric member 15 on the base member 11. Specifically, as shown in FIG. 2, the buffer member 13 is selectively formed to fill in the plurality of grooves 12a that is formed on a central portion of the oxide layer 12 whereby the plurality of grooves 12a formed on one end and another end of the oxide layer 1 is externally exposed. The buffer member 13 may adopt the same material as the oxide layer 12 so that the buffer member 13 may readily fill in the plurality of grooves 12a formed on the central portion of the oxide layer 12. Specifically, depending on the material of the oxide layer 12, the buffer member 13 may use any one of alumina ($Al_2O_3$), oxide niobium ($Nb_2O_5$), oxide tantalum ($Ta_2O_5$), oxide zirconium ($ZrO_2$), oxide titanium ($TiO_2$), oxide copper (CuO), and oxide zinc (ZnO).

The insulating member 14 is formed on another surface of the base member 11 in order to prevent the base member 11 from contacting with the external conductive material and being electrically short. Even when the oxide layer 12 with the plurality of grooves 12a is formed on another surface of the base member 11 as shown in FIG. 3, the insulating member 14 may adopt the same material as the buffer member 13 and readily fill in the grooves 12a. Specifically, depending on the material of the buffer member 13 using the same material as the oxide layer 12, the insulating member 13 may use any one of alumina ($Al_2O_3$), oxide niobium ($Nb_2O_5$), oxide tantalum ($Ta_2O_5$), oxide zirconium ($ZrO_2$), oxide titanium ($TiO_2$), oxide copper (CuO), and oxide zinc (ZnO).

Since the piezoelectric member 15 is formed using the buffer member 13 as a medium, it is possible to more easily manufacture the piezoelectric member 15. The piezoelectric member 15 may use oxide zinc (ZnO), aluminum nitride (AlN), barium titanium oxide ($BaTiO_3$), and piezoelectric series of piezoelectric ceramic, and a piezoelectric material with greater piezoelectric coefficient.

As described above, since the buffer member 13, the piezoelectric member 15, and a plurality of interdigal transducer (IDT) electrodes 16 and 17 are selectively formed on the oxide layer 12, thermal transmission may be increased by the plurality of grooves 12a formed on the oxide layer 12. Therefore, it is possible to enable high power when manufacturing the SAW filter 10 of FIG. 4 using the piezoelectric substrate 10a.

Hereinafter, a manufacturing of the piezoelectric substrate 10a constructed as above will be described with reference to the accompanying drawings.

Figure 5:
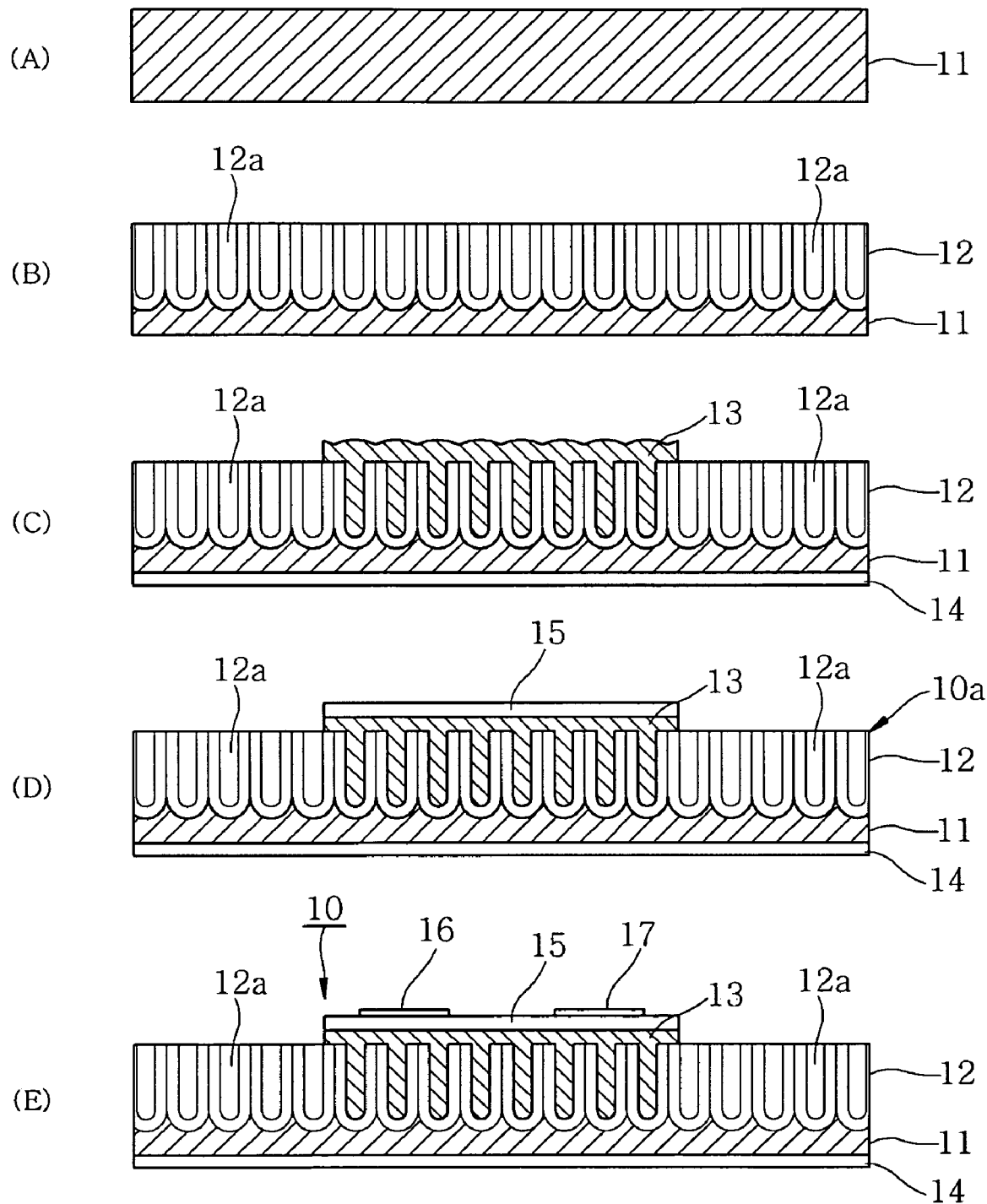
FIG. 5 illustrates a manufacturing process of a piezoelectric substrate and a SAW filter according to the present invention.

When the base member 11 is provided as shown in a part (A) of FIG. 5, the oxide layer 12 with the plurality of grooves 12a may be formed on one surface of the base member 11 by anodizing as shown in a part (B) of FIG. 5. The plurality of grooves formed on the oxide layer 12 has a nano-pore array structure. In order to improve thermal transmission, the oxide layer 12 may be formed to have the plurality of grooves on both surfaces of the base member 11. The oxide layer 12 with the plurality of grooves 12a may apply anodizing to the base member 11. The anodizing denotes technology that can apply a positive electrode to the base member 11 and apply a negative electrode to the solution and thereby can treat the surface.

The anodizing may form the oxide layer 12 on the base member 11 by oxygen generating from the positive electrode to thereby form a film.

In order to form the oxide layer 12 using anodizing, the base member 11 may be formed by using any one of aluminum (Al), niobium (Nb), tantalum (Ta), zirconium (Zr), titanium (Ti), copper (Cu), carbon monoxide (NbO), and zinc (Zn).

When the oxide layer 12 is formed on the base member 11, the buffer member 13 may be formed by selectively applying a buffer material on the oxide layer 12 to expose one end and another end of the oxide layer 12 as shown in a part (C) of FIG. 5. The buffer member 13 may be formed by masking a photosensitive film on remaining portions excluding a desired portion, i.e. on one end and another end of the oxide layer 12 using a photo process and then applying the buffer material thereon. The buffer member 13 as shown in the part (C) of FIG. 5 may be formed by removing the photosensitive film. When forming the buffer member 13, unevenness may significantly occur on the buffer member 13 as shown in the part (C) of FIG. 5. In this case, it is possible to polish the surface of the buffer member 13 using chemical mechanical polishing (CMP).

When the buffer member 13 is selectively formed on the oxide layer 12, the insulating member 14 may be formed by applying an insulating material on another surface of the base member 11 as shown in the part (C) of FIG. 5. When simultaneously or separately manufacturing the buffer member 13 and the insulating member 14, the insulating member 14 may be formed prior to forming of the buffer member 13. When the oxide layer 12 with the plurality of grooves 12a is formed on another surface of the base member 11 as shown in FIG. 6, the insulating member 14 may be formed to fill in the plurality of grooves 12a. When the insulating member 14 is formed to fill in the plurality of grooves 12a, polishing may be performed using CMP as necessary.

For simultaneous or separate manufacturing, the same material may be applied to the buffer material of the buffer member 13 and the insulating material of the insulating member 14. Specifically, each of the buffer material of the buffer member 13 and the insulating material of the insulating member 14 may use any one of alumina ($Al_2O_3$), oxide niobium ($Nb_2O_5$), oxide tantalum ($Ta_2O_5$), oxide zirconium ($ZrO_2$), oxide titanium ($TiO_2$) oxide copper (CuO), and oxide zinc (ZnO). The buffer member 13 and the insulating member 14 using such materials may be formed by any one of silk printing, dispensing, deposition, sputtering, CVD, air nozzle spraying, electrode plating, and electroless plating.

Air nozzle spraying may form any one of alumina ($Al_2O_3$), oxide niobium ($Nb_2O_5$), oxide tantalum ($Ta_2O_5$), oxide zirconium ($ZrO_2$), oxide titanium ($TiO_2$), oxide copper (CuO), and oxide zinc (ZnO) to oxide-based nano powders with the size of 10 nm through 100 nm and then quickly apply the nano powders. Since air nozzle spraying is applied, it is possible to readily fill the buffer member 13 or the insulating member 14 in the plurality of grooves 12a formed on the oxide layer 12.

When the buffer member 13 or the insulating member 14 is formed, the piezoelectric member 15 may be formed by applying a piezoelectric material on the buffer member 13. The piezoelectric member 15 may be formed on the buffer member 13 by using any one of silk printing, dispensing, deposition, sputtering, CVD, and air nozzle spraying.

The insulating member 14 and the piezoelectric member 15 may be manufactured by masking one end and another end of the oxide layer 12 using a photo process, so that the insulating member 14 and the piezoelectric member 15 may not be formed in the plurality of grooves 12a that is formed on one end and another end of the oxide layer 12.

Hereinafter, an embodiment of the SAW filter 10 using the piezoelectric substrate 10 will be described with reference to the accompanying drawings.

Figure 4:
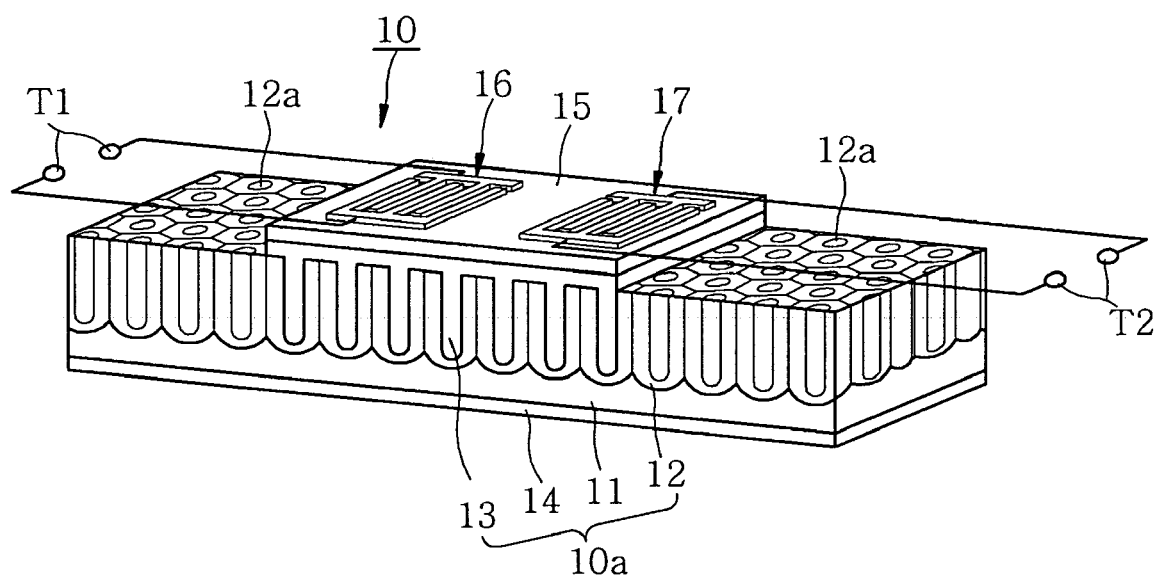
FIG. 4 is a perspective view of a SAW filter using a piezoelectric substrate according to the present invention.

FIG. 4 is a perspective view of the SAW filter 10. The SAW filter 10 includes a base member 11, an oxide layer 12, a buffer member 13, an insulating member 14, a piezoelectric member 15, and a plurality of IDT electrodes 16 and 17.

The base member 11, the oxide layer 12, the buffer member 13, the insulating member 14, and the piezoelectric member 15 of FIG. 4 constituting the SAW filter 10 have the same configuration and function of the base member 11, the oxide layer 12, the buffer member 13, the insulating member 14, and the piezoelectric member 15 of FIG. 2 and thus further detailed descriptions will be omitted here. Hereinafter, the plurality of IDT electrodes 16 and 17 will be described.

The plurality of IDT electrodes 16 and 17 may be formed on the piezoelectric member 15 to receive electrical signals, filter the same, and output the filtered electrical signals. Specifically, when electrical signals are received by a terminal Ti connecting with one of the plurality of IDT electrodes, for example, the IDT electrode 16, the piezoelectric member 15 may convert the electrical signals to mechanical signals and then filter the same by a pattern of the plurality of IDT electrodes 16 and 17. The filtered mechanical signals may be again transformed to electrical signals and be output via another terminal T2 connecting with remaining IDT electrode, for example, the IDT electrode 17.

When applying a greater electrical signal to the plurality of IDT electrodes 16 and 17, heat may be readily discharged via the plurality of grooves 12a formed on the buffer member 13 and the oxide layer 12, enabling the high power of the SAW filter 10. When the SAW filter 10 is applied to the high frequency and thereby the pattern of the plurality of IDT electrodes 16 and 17 is constructed as a narrow pitch, the thermal discharge may be simplified, preventing the short from occurring between patterns of the plurality of IDT electrodes 16 and 17 to improve durability.

Figure 1:
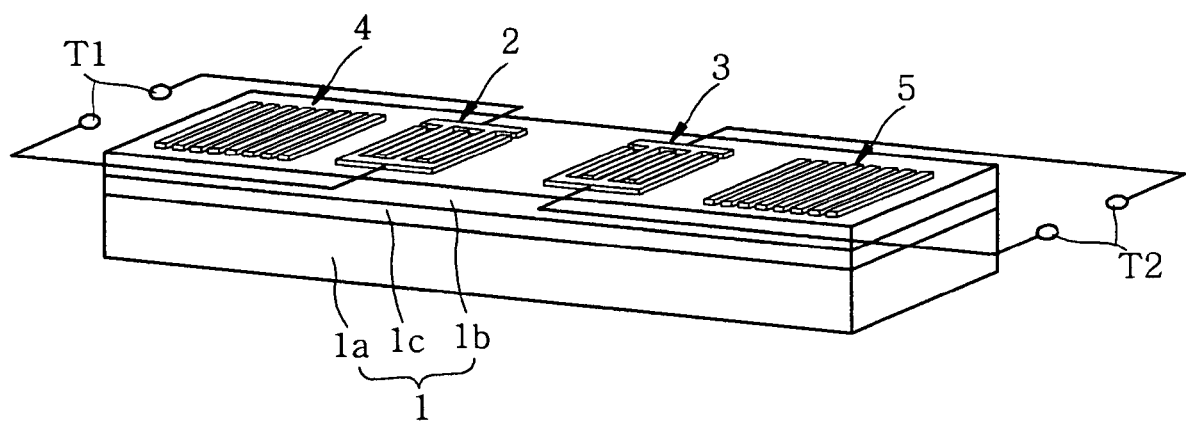
FIG. 1 is a perspective view of a conventional surface acoustic wave (SAW) filter.

As described above, the plurality of grooves 12a formed on one end and another end of the oxide layer 12 may be externally exposed by selectively forming the buffer member 13, the piezoelectric member 15, and the plurality of IDT electrodes 16 and 17 on the oxide layer 12. Therefore, it is possible to remove the bidirectional loss. Specifically, since the buffer member 13 formed on the oxide layer 12 fills in the plurality of grooves 12a, it is possible to remove the bidirectional loss by reflection due to a medium difference between a portion where the buffer member 13 is formed on the oxide layer 12 and one and another ends of the where the buffer member 13 is not formed. Therefore, the SAW filter 10 does not need to additionally form the reflectors 4 and 5 of FIG. 1 and thus it is possible to reduce the size of the SAW filter 10.

Hereinafter, a manufacturing method of the SAW filter 10 using the piezoelectric substrate 10a, constructed as above, will be described with reference to the accompanying drawings.

When the piezoelectric substrate 10a is manufactured as shown in parts (A) through (D) of FIG. 5, the SAW filter 10 may be manufactured using the piezoelectric substrate 10a. Specifically, when the piezoelectric member 15 is formed through the manufacturing process of the piezoelectric substrate 10a as shown in the part (D) of FIG. 5, the plurality of IDT electrodes 16 and 17 may be formed by a photo etching process after applying conductive material on the piezoelectric member 15 as shown in a part (E) of FIG. 5. The conductive material for forming the plurality of IDT electrodes 16 and 17 may be any one of aluminum (Al), niobium (Nb), tantalum (Ta), zirconium (Zr), titanium (Ti), copper (Cu), carbon monoxide (NbO), and zinc (Zn). The conductive material may be applied to the piezoelectric member 15 after masking one end and another end of the oxide layer 12 using a photo process, so that the conductive material may not be applied to the plurality of grooves 12a formed on one end and other end of the oxide layer 12.

When the conductive material is applied to the piezoelectric member 15, the applied conductive material may be masked and then the plurality of IDT electrodes 16 and 17 may be formed by using an etching process. The etching process may apply dry etching using a reactive ion etcher so that etching may simultaneously occur in horizontal and vertical directions.

According to the present invention, there is provided a piezoelectric substrate and a surface acoustic wave (SAW) filter that can improve thermal transmission by a plurality of grooves formed on a piezoelectric substrate and thus can enable high power when manufacturing a SAW filter and also can remove directional loss by the surface wave reflection using the plurality of grooves and thus can reduce the size of the SAW filter.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a piezoelectric substrate, comprising:
   forming an oxide layer with a plurality of grooves on one surface of a base member by anodizing;
   selectively applying a buffer material on the oxide layer to expose one end and another end of the oxide layer to form a buffer member;
   applying an insulating material on another surface of the base member to form an insulating member; and
   applying a piezoelectric material on the buffer member to form a piezoelectric member.

2. The method of claim 1, wherein, in the forming of the oxide layer, the plurality of grooves formed on the oxide layer is formed to have a nano-pore array structure.

3. The method of claim 1, wherein the forming of the oxide layer forms the oxide layer with the plurality of grooves on both surfaces of the base member by anodizing.

4. The method of claim 1, wherein in the forming of the buffer member and the forming of the insulating member, each of a buffer material and an insulating material uses any one of alumina ($Al_2O_3$), oxide niobium ($Nb_2O_5$), oxide tantalum ($Ta_2O_5$), oxide zirconium ($ZrO_2$), oxide titanium ($TiO_2$), oxide copper (CuO), and oxide zinc (ZnO).

5. The method of claim 1, wherein the forming of the buffer member further comprises polishing the surface of the buffer member using a chemical mechanical polishing (CMP) process.

6. The method of claim 1, wherein in the forming of the buffer member and the forming of the insulating member, each of the buffer material and the insulating material is applied by using any one of silk printing, sputtering, CVD, air nozzle spraying, electrode plating, and electroless plating.

7. The method of claim 1, wherein in the forming of the piezoelectric member, the piezoelectric material is applied by using any one of silk printing, sputtering, CVD, and air nozzle spraying.

* * * * *